United States Patent
Wu

(10) Patent No.: US 10,219,215 B2
(45) Date of Patent: Feb. 26, 2019

(54) NETWORK DRIVING CIRCUIT AND METHOD OF DRIVING NETWORK DEVICE

(71) Applicant: REALTEK SEMICONDUCTOR CORPORATION, Hsinchu (TW)

(72) Inventor: Chien-Ming Wu, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/831,956

(22) Filed: Dec. 5, 2017

(65) Prior Publication Data

US 2018/0160368 A1 Jun. 7, 2018

(30) Foreign Application Priority Data

Dec. 6, 2016 (TW) .............................. 105140176 A

(51) Int. Cl.
*H03M 1/06* (2006.01)
*H04W 52/02* (2009.01)
(Continued)

(52) U.S. Cl.
CPC ....... *H04W 52/0209* (2013.01); *H03M 1/002* (2013.01); *H03M 1/1071* (2013.01); *H04W 88/02* (2013.01)

(58) Field of Classification Search
CPC .......... H03M 1/06; H03M 1/66; H03M 1/682; H03M 1/742; H03M 1/0682; H03M 1/08; H03M 1/0836; H03M 1/0863; H03M 1/1009; H03M 1/745; H03M 3/382; H03M 3/408; H03M 1/002; H03M 1/0609;
(Continued)

(56) References Cited

U.S. PATENT DOCUMENTS 5,272,618 A * 12/1993 Blake .................. H02M 3/3378
363/25
6,313,776 B1 * 11/2001 Brown ................ H03M 1/0607
341/144
(Continued)

FOREIGN PATENT DOCUMENTS

TW I220350 8/2004

OTHER PUBLICATIONS

ISSCC paper: 'A 12b 2.9GSs DAC with IM3-60dBc beyond 1GHz in 65nm CMOS'.
(Continued)

*Primary Examiner* — Linh Nguyen
(74) *Attorney, Agent, or Firm* — WPAT, PC

(57) ABSTRACT

A method of driving a network device for outputting signals to a physical network transmission medium. The network device includes a DAC circuit that comprises a plurality of digital-to-analog conversion units. Each digital-to-analog conversion unit includes a first auxiliary current source and a second auxiliary current source. The method includes the steps of: detecting a length of the physical network transmission medium; generating a control signal according to the length; generating a bias signal according to the control signal; applying the bias signal to the first auxiliary current source and the second auxiliary current source to control the currents of the first auxiliary current source and the second auxiliary current source.

18 Claims, 9 Drawing Sheets

(51) Int. Cl.
*H03M 1/00* (2006.01)
*H03M 1/10* (2006.01)
*H04W 88/02* (2009.01)

(58) Field of Classification Search
CPC . H04L 12/10; H04L 25/0282; H04L 25/0276; H04L 25/0286; H04L 25/03834; H04L 25/08; H04L 25/14; H04L 25/0272; H04L 25/0266; H04L 25/028; H04L 25/085; H04L 12/413; H04L 25/0292; H04L 25/0296
USPC .......................... 341/118, 120, 139, 142, 144
See application file for complete search history.

(56) References Cited

U.S. PATENT DOCUMENTS

| | | | | |
|---|---|---|---|---|
| 6,674,382 B1* | 1/2004 | Jordan | ............... | H04L 25/0266 341/130 |
| 8,446,184 B2* | 5/2013 | Van Der Goes | ........ | H04L 12/10 327/108 |
| 8,885,814 B2* | 11/2014 | Hurwitz | ............... | H04B 3/54 379/386 |
| 9,231,538 B1* | 1/2016 | Birkeland | .............. | H03F 1/0266 |
| 9,319,061 B1* | 4/2016 | Azarmnia | ............... | H03M 1/66 |
| 9,369,180 B1* | 6/2016 | Bonicatto | .............. | H04B 3/542 |
| 2001/0016021 A1* | 8/2001 | Chan | ...................... | H04B 1/586 375/346 |
| 2002/0186077 A1* | 12/2002 | Jantzi | ................... | H03G 1/0088 330/51 |
| 2002/0188957 A1* | 12/2002 | Jantzi | ................... | H03G 1/0088 725/111 |
| 2004/0096005 A1* | 5/2004 | Zabroda | ................ | H04L 12/413 375/257 |
| 2006/0018388 A1* | 1/2006 | Chan | ........................ | H04B 3/23 375/257 |
| 2006/0270365 A1* | 11/2006 | Kehlenbach | .......... | H03F 1/3247 455/114.3 |
| 2007/0127501 A1 | 6/2007 | Zabroda | | |
| 2009/0315700 A1* | 12/2009 | Hurwitz | ................... | H04B 3/56 340/538 |
| 2013/0003420 A1* | 1/2013 | Ye | ..................... | H02M 3/33515 363/17 |
| 2014/0159933 A1 | 6/2014 | Dufrene et al. | | |
| 2014/0307867 A1* | 10/2014 | Chu | ........................ | H04L 12/00 379/392.01 |
| 2016/0072735 A1* | 3/2016 | Seth | ...................... | H03F 1/0277 370/419 |

OTHER PUBLICATIONS

Summary of the OA letter: Reference 1 (US 20070127501), Reference 2(TW I220350),and Reference 3(US 20140159933) render claims 1-10 obvious. Taiwan Patent Office "Office Action" dated Apr. 11, 2018, Taiwan.
Taiwan Patent Office "Office Action" dated Apr. 11, 2018, Taiwan.

* cited by examiner

NETWORK DRIVING CIRCUIT AND METHOD OF DRIVING NETWORK DEVICE

BACKGROUND OF THE INVENTION

1. Field of the Invention

The present invention generally relates to network applications, and, more particularly, to a network driving circuit and a method of driving network devices.

2. Description of Related Art

A driving circuit of a network device often utilizes a digital-to-analog converter (DAC) circuit to convert digital signals to analog signals, and then output the analog signals to the physical transport medium of the network. The physical transmission medium of the network includes, for example, twisted pairs, co-axial cables, and fiber optical cables. Some situations of network applications (such as transmission of data signals over a long physical transmission medium) require a high degree of linearity for network devices, while other situations do not require such linearity. Blindly improving the linearity of the driving circuit without considering the actual situation of the network application may bring shortcomings, such as increased power consumption of the DAC circuit situations or applications that do not require a high degree of linearity.

SUMMARY OF THE INVENTION

In view of the issues of the prior art, an object of the present invention is to provide a network driving circuit and a method of driving network devices, so as to reduce power consumption of driving circuits.

A network driving circuit is disclosed. The network driving circuit comprises a digital-to-analog converter (DAC) circuit, a line driver circuit, a transformer circuit, a control circuit, and a bias circuit. The DAC circuit converts a digital output signal to an analog output signal. The line driver circuit, which is coupled to the DAC circuit, is configured to amplify the analog output signal. The transformer circuit, which is coupled to the line driver circuit, couples the analog output signal to a physical network transmission medium. The control circuit, which is coupled to the DAC circuit, generates a control signal according to a length of the physical network transmission medium. The bias circuit, which is coupled to the control circuit, generates a bias signal associated with the length according to the control signal. The DAC circuit comprises a plurality of digital-to-analog conversion units. Each digital-to-analog conversion unit comprises a main current source and an auxiliary current source. A bias voltage of the auxiliary current source is controlled by the bias signal.

A network driving circuit is also disclosed. The network driving circuit outputs a signal to a physical network transmission medium and comprises a digital-to-analog converter (DAC) circuit, a transformer circuit, and a bias circuit. The DAC circuit comprises a plurality of digital-to-analog conversion units and converts a digital output signal to an analog output signal. Each digital-to-analog conversion unit comprises a first auxiliary current source and a second auxiliary current source. The transformer circuit, which is coupled to the DAC circuit, couples the analog output signal to the physical network transmission medium. The bias circuit generates a bias signal associated with a length of the physical network transmission medium to control currents of the first auxiliary current source and the second auxiliary current source.

A method of driving a network device is also disclosed. The method drives a network device to output a signal to a physical network transmission medium. The network device comprises a digital-to-analog converter (DAC) circuit that comprises a plurality of digital-to-analog conversion units. Each digital-to-analog conversion unit comprises a first auxiliary current source and a second auxiliary current source. The method comprises steps of: detecting a length of the physical network transmission medium; generating a control signal according to the length; generating a bias signal according to the control signal; and applying the bias signal to the first auxiliary current source and the second auxiliary current source to control currents of the first auxiliary current source and the second auxiliary current source.

The network driving circuit and the method of driving network devices of the present invention are capable of adaptively adjusting the linearity to avoid causing additional power consumption on the driving circuits. Compared with the conventional technology, the network driving circuit and the method of driving network devices of the present invention are more power-efficient.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
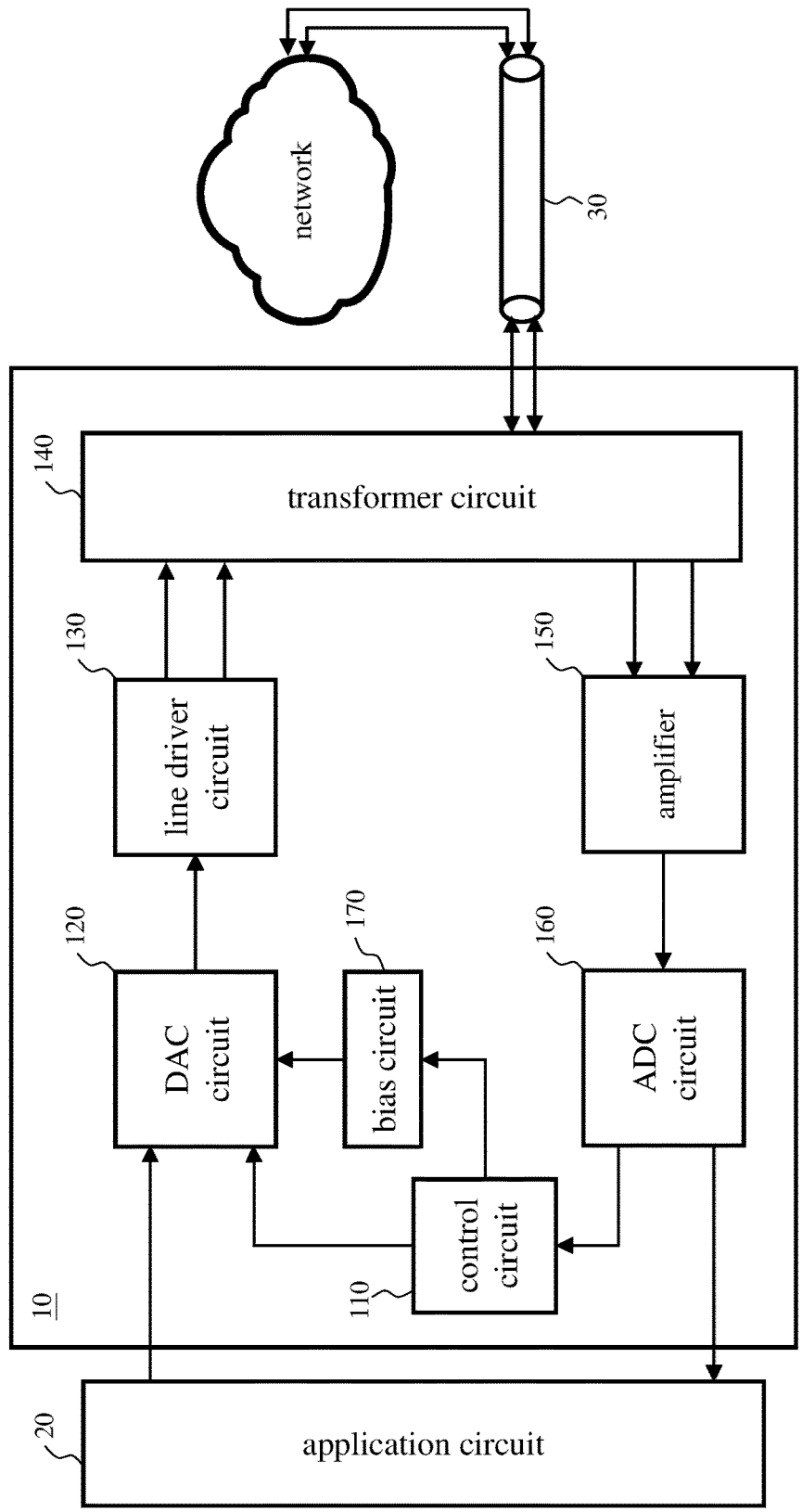
FIG. 1 shows a functional block diagram of a network driving circuit according to an embodiment of the present invention.

FIG. 1 is a functional block diagram of a network driving circuit according to an embodiment of the present invention. The network driving circuit 10 is provided in a network device and includes a control circuit 110, a DAC circuit 120, a line driver circuit 130, a transformer circuit 140, an amplifier 150, an analog-to-digital converter (ADC) circuit 160 and a bias circuit 170. The application circuit 20 generates a digital output signal to be transmitted, such as a sound signal, a video signal, or other data signals. The digital output signal is converted to an analog output signal by the network driving circuit 10 and then transmitted to the network via the physical network transmission medium 30 (e.g., Ethernet). On the other hand, the analog signal received from the network is transmitted to the application circuit 20 through the network driving circuit 10. The analog signal is converted by the network driving circuit 10 into a digital signal that can be processed by the application circuit 20. The network driving circuit 10 and the application circuit 20 may be separate circuits or simultaneously integrated into a system on chip (SoC).

The control circuit 110 of the network driving circuit 10 can detect the length of the physical network transmission medium 30. The control circuit 110 sends a digital test signal, which is converted to an analog test signal by the DAC circuit 120, and then enhanced by the line driver circuit 130 before being coupled to the physical network transmission medium 30 via the transformer circuit 140. A reflected signal is generated from reflection of the analog test signal on the physical network transmission medium 30, and the reflected signal is coupled back to the network driving circuit 10 via the transformer circuit 140. The reflected signal is then amplified by the amplifier 150 and then converted to a digital reflected signal by the ADC circuit 160. The control circuit 110 then determines the length of the physical network transmission medium 30 based on the digital reflected signal. The detection method of the control circuit 110 is well known to those skilled in the art and the detailed description is thus omitted for brevity. In addition, the control circuit 110 may learn the transmission rate of the network driving circuit 10 according to the configuration of the network driving circuit 10. This configuration may be stored in a register inside the network driving circuit 10 or be stored in an external memory (not shown).

Figure 2:
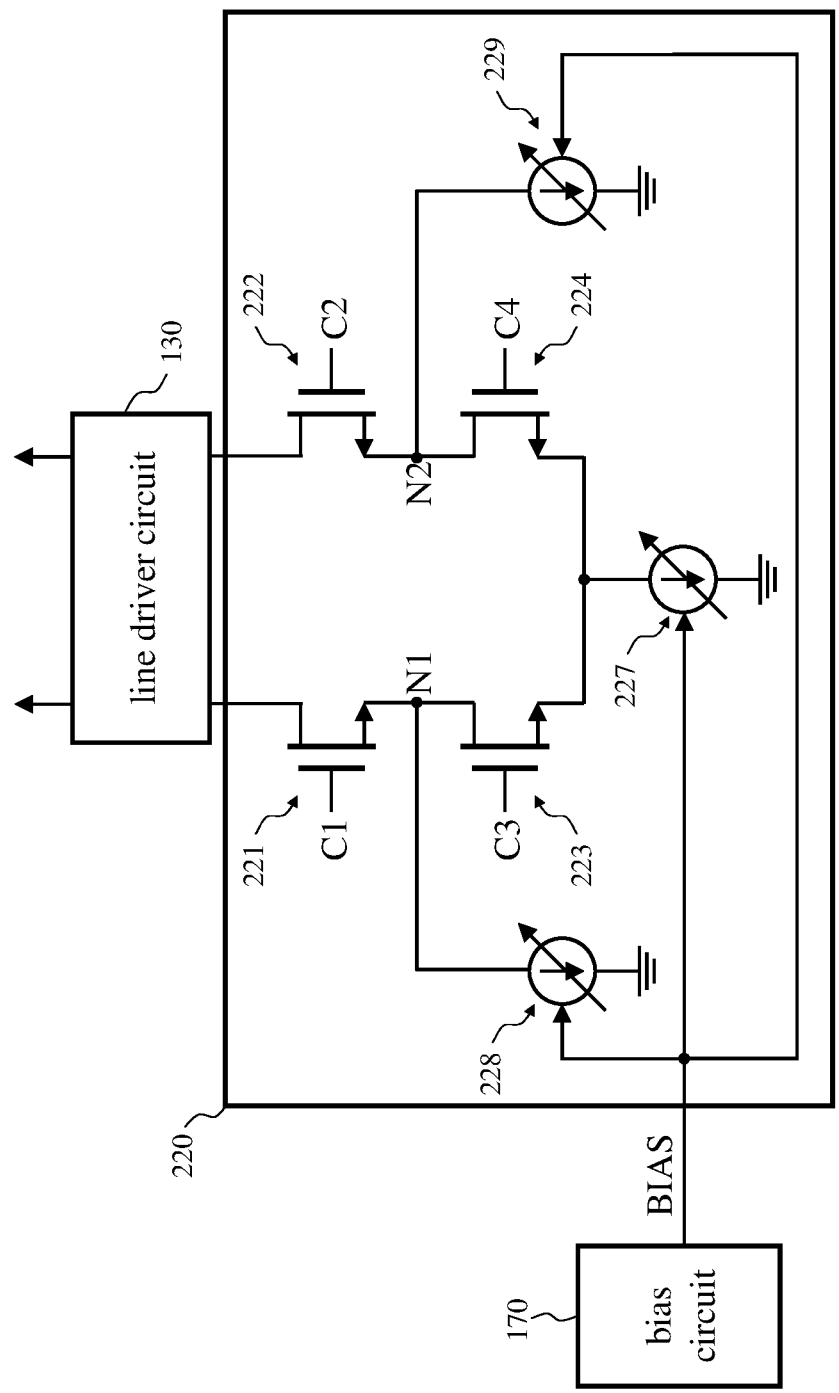
FIG. 2 shows a circuit diagram of a digital-to-analog conversion unit according to an embodiment of this invention.

In general, when the transmission rate of the network driving circuit 10 is higher and/or the length of the physical network transmission medium 30 is longer, the network driving circuit 10 requires a higher linearity. One way to increase the linearity of the network driving circuit 10 is to add an auxiliary current source to the DAC circuit 120. The DAC circuit 120 includes a plurality of digital-to-analog conversion units, one of which is shown in FIG. 2 as an example for illustrating part of the internal circuit of the DAC circuit 120 and the connection relationships of the DAC circuit 120 with the line driver circuit 130 and the bias circuit 170. The digital-to-analog conversion unit 220 includes transistors 221, 222, 223, and 224, which have control terminals C1, C2, C3 and C4, respectively. One of the two remaining terminals of the transistor 221 is connected to the line driver circuit 130 and the other terminal is connected to a node N1. One of the two remaining terminals of the transistor 222 is connected to the line driver circuit 130 and the other terminal is connected to a node N2. One of the two remaining terminals of the transistor 223 is connected to the node N1 and the other terminal is connected to the main current source 227. One of the two remaining terminals of the transistor 224 is connected to the node N2 and the other terminal is connected to the main current source 227. In operation, the transistors 221, 222, 223, and 224 are used as switches. The switching states of the transistors 221, 222, 223, and 224 can be controlled by inputting control signals at the control terminals C1, C2, C3, and C4, so as to control the current passing through the line driver circuit 130. In the embodiment of FIG. 1, the control signal may be from the application circuit 20 or the control circuit 110.

In order to improve the linearity, the digital-to-analog conversion unit 220 further includes an auxiliary current source 228 and an auxiliary current source 229. The auxiliary current source 228 and the auxiliary current source 229 are coupled to the node N1 and the node N2, respectively. The bias voltages of the main current source 227, the auxiliary current source 228 and the auxiliary current source 229 are controlled by the bias signal BIAS outputted by the bias circuit 170. In general, when the bias signal is greater, the current source provides a greater current. When the control circuit 110 measures a longer length of the physical network transmission medium 30, the control circuit 110 controls the bias circuit 170 to output a greater bias signal (e.g., with greater magnitude) to increase the linearity. In contrast, when the control circuit 110 measures a shorter length of the physical network transmission medium 30, the control circuit 110 controls the bias circuit 170 to output a smaller bias signal (i.e., with smaller magnitude) to reduce the power consumption of the circuit. In addition to the length, the transmission rate of the network driving circuit 10 (i.e., the transmission rate of the network device) may be one of the determinants of the bias signal. When the network driving circuit 10 operates in a mode with a higher transmission rate, the control circuit 110 controls the bias circuit 170 to output a greater bias signal to improve the linearity. In contrast, when the network driving circuit 10 operates in a mode with a lower transmission rate, the control circuit 110 controls the bias circuit 170 to output a smaller bias signal to reduce the power consumption of the circuit. Thus, the control circuit 110 may control the bias signal of the bias circuit 170 in accordance with one of the length of the physical network transmission medium 30 and the transmission rate; that is, the bias signal is associated with one of the length and the transmission rate, and is independent of the other. Alternatively, the control circuit 110 may control the bias signal of the bias circuit 170 according to both the length of the physical network transmission medium 30 and the transmission rate of the network driving circuit 10; that is, the bias signal is associated with both the length and the transmission rate.

The following Tables 1 to 3 show examples of the relationship between the current boosting range of the auxiliary current source and the transmission rate as well as the length. Table 1 shows that the current adjustment of the auxiliary current is associated merely with the transmission rate and is independent of the length. Table 2 shows that the current adjustment of the auxiliary current is associated merely with the length and is independent of the transmission rate. Table 3 shows that the current adjustment of the auxiliary current is associated with both the length and the transmission rate. It is assumed that the amount of current of the main current source 227 is 40 mA, which is the sum of the currents of all main current sources 227 of all digital-to-analog conversion units 220 of the DAC circuit 120.

TABLE 1

| transmission rate (bps) | current of main current source (mA) | length (M) | current boosting range relative to the main current source (%) |
|---|---|---|---|
| 100M | 40 | 10 | 0 |
|  |  | 100 | 0 |
|  |  | 1000 | 0 |
| 1G | 40 | 10 | 4 |
|  |  | 100 | 4 |
|  |  | 1000 | 4 |
| 10G | 40 | 10 | 8 |
|  |  | 100 | 8 |
|  |  | 1000 | 8 |

TABLE 2

| transmission rate (bps) | current of main current source (mA) | length (M) | current boosting range relative to the main current source (%) |
|---|---|---|---|
| 100M | 40 | 10 | 0 |
|  |  | 100 | 5 |
|  |  | 1000 | 10 |
| 1G | 40 | 10 | 0 |
|  |  | 100 | 5 |
|  |  | 1000 | 10 |
| 10G | 40 | 10 | 0 |
|  |  | 100 | 5 |
|  |  | 1000 | 10 |

TABLE 3

| transmission rate (bps) | current of main current source (mA) | length (M) | current boosting range relative to the main current source (%) |
|---|---|---|---|
| 100M | 40 | 10 | 0 |
|  |  | 100 | 5 |
|  |  | 1000 | 10 |
| 1G | 40 | 10 | 2 |
|  |  | 100 | 7 |
|  |  | 1000 | 12 |
| 10G | 40 | 10 | 4 |
|  |  | 100 | 10 |
|  |  | 1000 | 15 |

In the example shown in Table 1, when the transmission rate of the network driving circuit 10 is 100 Mbps, 1 Gbps, and 10 Gbps, the current boosting ranges of the auxiliary current source 228 and the auxiliary current source 229 with respect to the main current source 227 are respectively 0%, 4% and 8% (i.e., the amounts of currents increased are 0 mA, 1.6 mA and 3.2 mA, respectively). This boosting range is associated merely with the transmission rate and is independent of the length. In this example, since the transmission rate of 100 Mbps is relatively low, the additional amount of currents supplied by the auxiliary current source 228 and the auxiliary current source 229 are set to zero. The example of Table 1 shows that the control circuit 110 controls the bias circuit 170 in accordance with merely the transmission rate; that is, the control signal of the control circuit 110 and the bias signal BIAS of the bias circuit 170 are associated merely with the transmission rate and are independent of the length.

In the example shown in Table 2, when the lengths are 10 M, 100 M, and 1000 M, the current boost ranges of the auxiliary current source 228 and the auxiliary current source 229 with respect to the main current source 227 are 0%, 5%, and 10%, respectively, (i.e., the amounts of currents increased are 0 mA, 2 mA and 4 mA, respectively). This boosting range is associated merely with the length and is independent of the transmission rate. In this example, since the length of 10 M is relatively short, the additional amounts of currents supplied by the auxiliary current source 228 and the auxiliary current source 229 are set to zero. The example of Table 2 shows that the control circuit 110 controls the bias circuit 170 in accordance with merely the length; that is, the control signal of the control circuit 110 and the bias signal BIAS of the bias circuit 170 are associated merely with the length and are independent of the transmission rate.

In the example shown in Table 3, the current boosting ranges of the auxiliary current source 228 and the auxiliary current source 229 with respect to the main current source 227 are associated with both the transmission rate and the length. Basically, when the transmission rate is higher or the length is longer, the current boost ranges of the auxiliary current source 228 and the auxiliary current source 229 become greater. The example of Table 3 shows that the control circuit 110 controls the bias circuit 170 according to both the transmission rate and the length; that is, the control signal of the control circuit 110 and the bias signal BIAS of the bias circuit 170 are associated with both the transmission rate and the length.

It can be understood from the above example that, the network driving circuit 10 of the present invention can adaptively adjust the amount of current of the auxiliary current source of the DAC circuit 120 according to the practical applications. Therefore, it is possible to reduce the power consumption of the DAC circuit 120 by increasing the current of the auxiliary current source when high linearity is required and reducing the current of the auxiliary current source when high linearity is not required. In the embodiment shown in FIG. 2, the main current source 227, the auxiliary current source 228 and the auxiliary current source 229 are controlled by the same bias signal. Despite having substantially the same bias voltage, the main current source 227, the auxiliary current source 228 and the auxiliary current source 229 may still provide different amounts of currents when different circuit designs or different element sizes are applied. For example, with a proper design, the main current source 227 may provide a current greater than the auxiliary current source 228 and the auxiliary current source 229 under substantially the same bias voltage.

Figure 3:
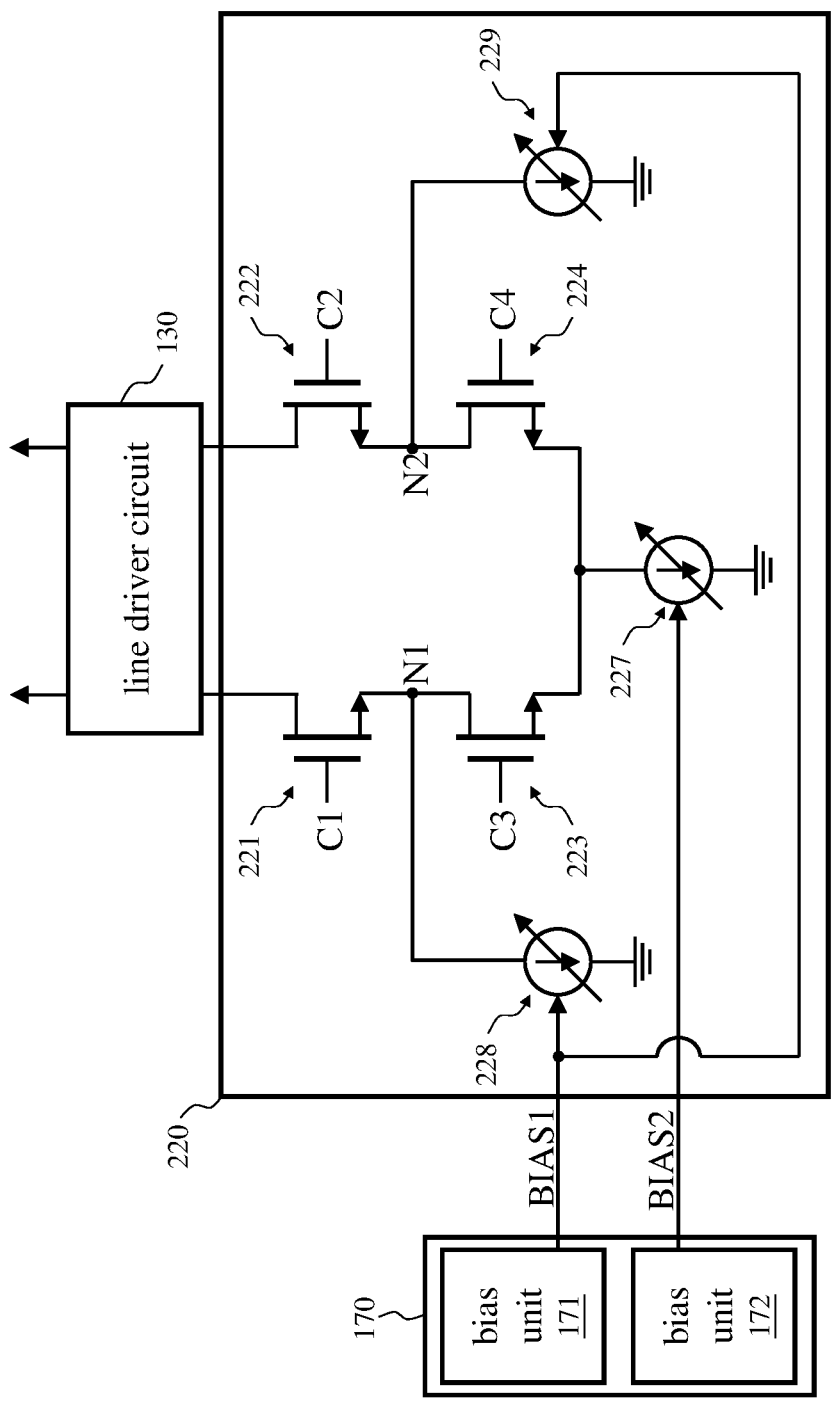
FIG. 3 shows a circuit diagram of a digital-to-analog conversion unit according to another embodiment of this invention.

FIG. 3 is a circuit diagram of the digital-to-analog conversion unit according to another embodiment of the present invention. In this embodiment, the main current source 227 of the digital-to-analog conversion unit 220, distinct from the auxiliary current source 228 and the auxiliary current source 229, receives a different bias signal. More specifically, the bias circuit 170 includes two bias units 171 and 172. The bias unit 171 provides the auxiliary current source 228 and the auxiliary current source 229 with bias signal BIAS1 that is associated with the length of the physical network transmission medium 30 and/or the transmission rate of the network driving circuit 10, while the bias unit 172 provides the main current source 227 with bias signal BIAS2 that is independent of the length of the physical network transmission medium 30 and the transmission rate of the network driving circuit 10. As a result, the amount of current of the main current source 227 can be independently adjusted from the amounts of currents of the auxiliary current source 228 and the auxiliary current source 229, and stay unaffected by the length and the transmission rate.

Figure 4:
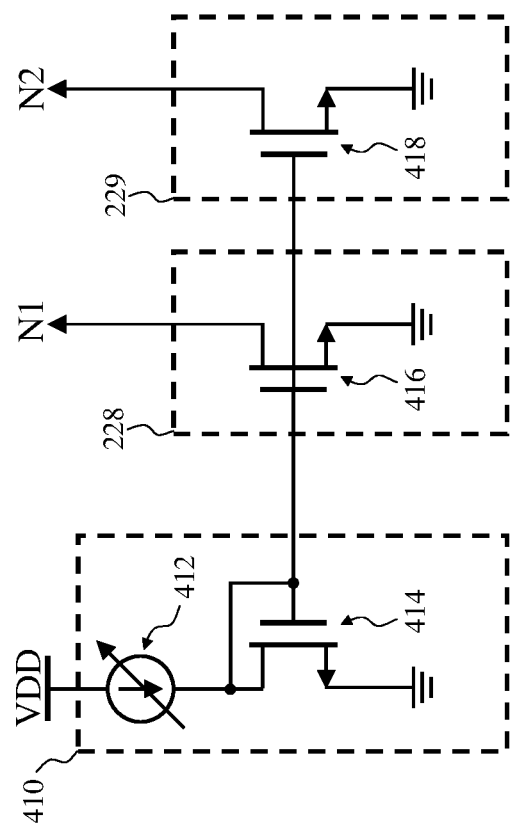
FIG. 4 is a diagram showing a connection between a bias unit and auxiliary current sources according to an embodiment of the present invention.

FIG. 4 is a diagram showing a connection between the bias unit and the auxiliary current sources according to an embodiment of the present invention. The bias unit 410 includes a current source 412 and a transistor 414, and the auxiliary current source 228 and the auxiliary current source 229 include transistors 416 and 418, respectively. The gate of the transistor 414 is connected to the drain of the transistor 414 and is further connected to the gates of the transistor 416 and the transistor 418. By changing the current of the current source 412, the bias voltages of the auxiliary current source 228 and the auxiliary current source 229 can be changed; that is, the currents passing through the transistor 416 and the transistor 418 can be changed. Basically, according to the circuit configuration of FIG. 4, the current provided by the auxiliary current source 228 is substantially same-valued as the current provided by the auxiliary current source 229. The bias unit 410 shows one of the embodiments of the bias circuit 170 in FIG. 2, or the bias unit 171 or the bias unit 172 in FIG. 3.

Figure 5:
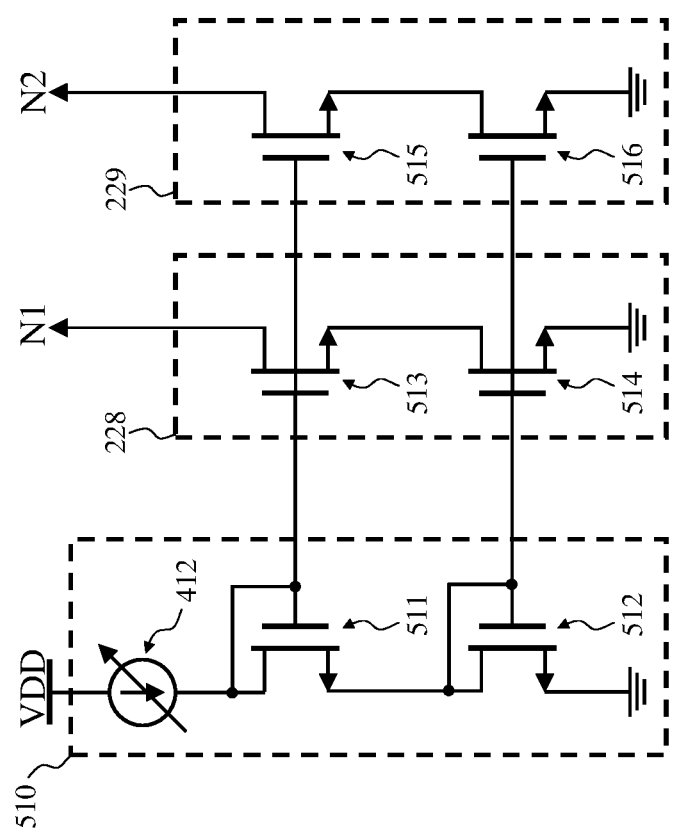
FIG. 5 is a diagram showing a connection between a bias unit and auxiliary current sources according to another embodiment of the present invention.

FIG. 5 is a diagram showing a connection between the bias unit and the auxiliary current sources according to another embodiment of the present invention. The bias unit 510 includes a current source 412, a transistor 511, and a transistor 512. The auxiliary current source 228 includes transistors 513 and 514, and the auxiliary current source 229 includes transistors 515 and 516. Compared to FIG. 4, the auxiliary current source 228 and the auxiliary current source 229 of FIG. 5 each includes another transistor connected in series to increase the output impedance. The gate of the transistor 511 is connected to the drain of the transistor 511 and is further connected to the gates of the transistor 513 and the transistor 515. The gate of the transistor 512 is connected to the drain of the transistor 512 and is further connected to the gates of the transistor 514 and the transistor 516. Similarly, by adjusting the current of the current source 412, the bias voltages of the auxiliary current source 228 and the auxiliary current source 229 can be changed; that is, the currents passing through the transistors therein can be changed. Basically, according to the circuit configuration of FIG. 5, the current provided by the auxiliary current source 228 is substantially same-valued as the current provided by the auxiliary current source 229. The bias unit 510 shows one of the embodiments of the bias circuit 170 in FIG. 2, or the bias unit 171 or the bias unit 172 in FIG. 3.

Figure 6:
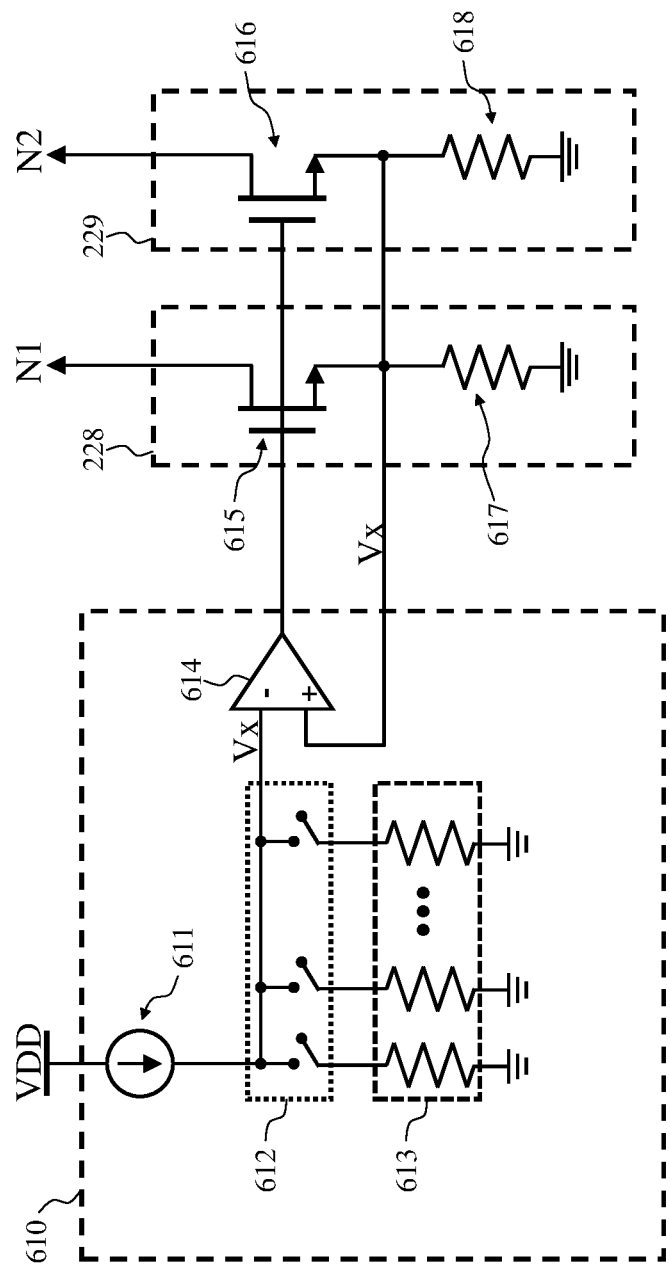
FIG. 6 is a diagram showing a connection between a bias unit and auxiliary current sources according to another embodiment of the present invention.

FIG. 6 is a diagram showing a connection between the bias unit and the auxiliary current sources according to another embodiment of the present invention. The bias unit 610 includes a current source 611, a switch array 612, a resistor array 613, and an operational amplifier 614. The auxiliary current source 228 includes a transistor 615 and a resistor 617, and the auxiliary current source 229 includes a transistor 616 and a resistor 618. The current source 611 provides a fixed current. Depending on the number of conducted switches (controlled by the control circuit 110) of the switch array 612, the resistor array 613 produces different equivalent resistance values, causing the voltage Vx at the inverting input of the operational amplifier 614 to change. According to the characteristics of the operational amplifier 614, the non-inverting input terminal of the operational amplifier 614 can produce a substantially same voltage Vx, which serves as the bias voltages of the auxiliary current source 228 and the auxiliary current source 229. The resistance values of the resistor 617 and the resistor 618 are substantially the same, so that the current provided by the auxiliary current source 228 is substantially same-valued as the current provided by the auxiliary current source 229. By adjusting the switching state of the switch array 612, the bias voltages of the auxiliary current source 228 and the auxiliary current source 229 can be changed; that is, the currents passing through the transistor 615 and the transistor 618 can be changed. The bias unit 610 shows one of the embodiments of the bias circuit 170 in FIG. 2, or the bias unit 171 or the bias unit 172 in FIG. 3.

Figure 7:
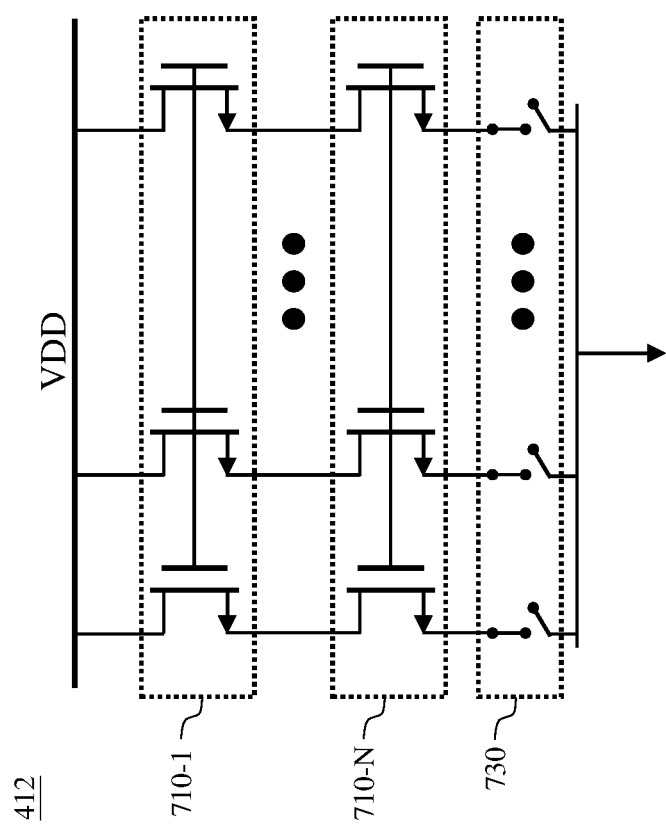
FIG. 7 is a detailed circuit diagram of the current source 412 according to an embodiment of the present invention.

FIG. 7 is a detailed circuit diagram of the current source 412 according to an embodiment of the present invention. The current source 412 includes N (N being a positive integer) serially-connected transistor arrays 710, and the gates of the transistors in each transistor array 710 are connected to one another. N transistor arrays 710 are further connected in series with a switch array 730. The total output current of current source 412 can be adjusted by controlling the number of conducted switches (controlled by the control circuit 110) of the switch array 730.

Figure 8:
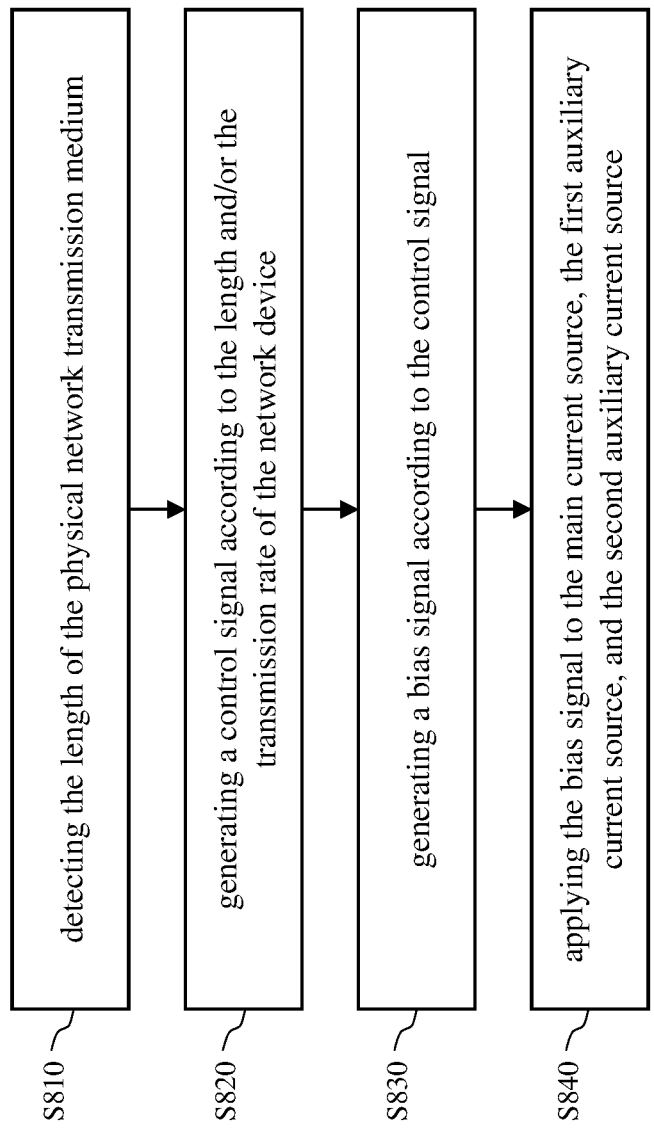
FIG. 8 shows a flow chart of the method of driving a network device according to an embodiment of the present invention.

In addition to the aforementioned network drive circuit, the present invention also discloses a driving method applied to a network device. The method can adjust linearity according to a length of the physical network transmission medium and/or a transmission rate of the network device. The method is performed by the network driving circuit 10 disclosed above or its equivalents. The network device includes a DAC circuit for converting a digital output signal to an analog output signal. The DAC circuit includes a plurality of digital-to-analog conversion units, and each analog conversion unit includes a main current source, a first auxiliary current source, and a second auxiliary current source. FIG. 8 is a flow chart of the method according to an embodiment of the present invention. The method includes the following steps.

In step S810, the length of the physical network transmission medium is detected. The setting of the linearity of the network device is associated with the length of the physical network transmission medium. In general, when the length of the physical network transmission medium is longer, the network device needs a higher linearity.

In step S820, a control signal is generated according to the length and/or the transmission rate of the network device. The transmission rate is also one of the factors that can be taken into account when setting the linearity of the network device. The control signal may be associated only with one, or both, of the length and the transmission rate.

In step S830, a bias signal is generated according to the control signal. Since the control signal is associated with the length of the physical network transmission medium and/or the transmission rate of the network device, the bias signal is also associated with the length of the physical network transmission medium and/or the transmission rate of the network device. In one embodiment, the control signal is utilized to control the switching state of a switch array. As shown in FIG. 6, the different switching states of the switch array 612 cause the voltage Vx (i.e., the bias signal) to change; also as shown in FIG. 7, the different switching states of switch array 730 cause the total output current of current source 412 to change, thereby causing the bias unit 410 of FIG. 4 and the bias unit 510 of FIG. 5 to generate different bias signals.

In step S840, the bias signal is applied to the main current source, the first auxiliary current source, and the second auxiliary current source. The current source of each digital-to-analog conversion unit of the DAC circuit is adjusted according to the bias signal to improve the linearity. That is, the linearity can be adjusted according to the length of the physical network transmission medium and/or the transmission rate of the network device. In general, when the length becomes longer and/or the transfer rate becomes higher, the linearity can be increased by increasing the currents of the first auxiliary current source and the second auxiliary current source; when the length becomes shorter and/or the transmission rate becomes lower, the currents of the first auxiliary current source and the second auxiliary current source can be reduced to reduce the power consumption of the DAC circuit.

The aforementioned bias signals and control signals can be designed according to the examples shown in Tables 1 to 3 and the device characteristics of the circuit (e.g., the number of resistors, resistance values, the number of transistors, the size of the transistors, etc.).

Figure 9:
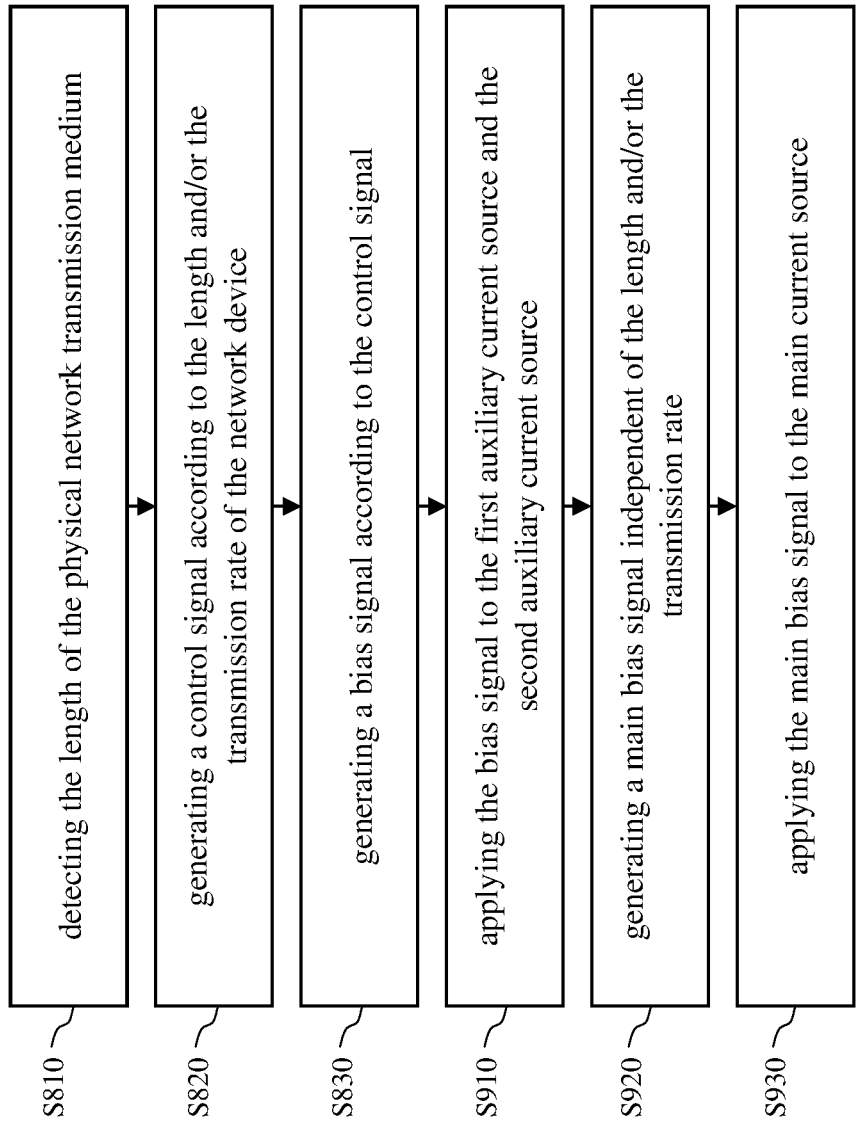
FIG. 9 shows a flow chart of the method of driving a network device according to another embodiment of the present invention.

FIG. 9 is a flow chart of this method according to another embodiment of the present invention, where steps S810 to S830 are the same as those in FIG. 8. The embodiment of FIG. 9 further includes the following steps.

In step S910, the bias signal is applied to the first auxiliary current source and the second auxiliary current source. In the present embodiment, a bias signal associated with the length of the physical network transmission medium and/or the transmission rate of the network device is applied to the first auxiliary current source and the second auxiliary current source, but not applied to the main current source.

In step S920, a main bias signal independent of the length and/or the transmission rate is generated. This step additionally generates a main bias signal that is independent of the length of the physical network transmission medium and/or the transmission rate of the network device.

In step S930, the main bias signal is applied to the main current source.

In the embodiment of FIG. 9, the main current source is independently adjusted from the auxiliary current sources so that the main current source is not affected by the length of the physical network transmission medium and the transmission rate of the network device, increasing the design flexibility of this invention.

Although the transistors shown in the figures are n-type metal-oxide-semiconductor field-effect-transistors (MOSFETs), the present invention can also be implemented by p-type MOSFETs or a combination of n-type and p-type MOSFETs. In addition, the aforementioned transistors are not limited to MOSFETs, and other transistors can also be applied to the present invention, such as junction field-effect-transistors (JFETs), polymer field-effect-transistors (PFETs), bipolar-junction transistors (BJTs) and so on.

In some embodiments, the control circuit 110 can be implemented as a hardware circuit alone, or as a processor, controller, or micro control unit (MCU) that executes program codes or instructions to realize the functions. The bias unit and the digital-to-analog conversion unit can be implemented by hardware.

Since people of ordinary skill in the art can appreciate the implementation detail and the modification thereto of the present method invention of FIG. 8 and FIG. 9 through the disclosure of the device invention of FIG. 1 to FIG. 7, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention. Although the foregoing embodiments use Ethernet as an example, people skilled in the art can apply this invention to other types of networks according to the above disclosures.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A network driving circuit comprising:
   a digital-to-analog converter (DAC) circuit configured for converting a digital output signal to an analog output signal;
   a line driver circuit, coupled to said DAC circuit, configured for amplifying said analog output signal;
   a transformer circuit, coupled to said line driver circuit, for coupling said analog output signal to a physical network transmission medium;
   a control circuit, coupled to said DAC circuit, configured for generating a control signal according to a length of said physical network transmission medium; and
   a bias circuit, coupled to said control circuit, configured for generating a bias signal associated with said length according to said control signal;
   wherein, said DAC circuit comprises a plurality of digital-to-analog conversion units, each digital-to-analog conversion unit comprising a main current source and an auxiliary current source, and a bias voltage of said auxiliary current source is controlled by said bias signal.

2. The network driving circuit of claim 1, wherein when said length becomes longer, said bias circuit is controlled by said control signal to generate said bias signal with greater magnitude to increase a current of said auxiliary current source, and when said length becomes shorter, said bias circuit is controlled by said control signal to generate said bias signal with smaller magnitude to reduce said current of said auxiliary current source.

3. The network driving circuit of claim 1, wherein said bias circuit further generates a main bias signal independent of said length, and a bias voltage of said main current source is controlled by said main bias signal.

4. The network driving circuit of claim 1, wherein a bias voltage of said main current source is controlled by said bias signal.

5. The network driving circuit of claim 1, wherein said control circuit generates said control signal further according to a transmission rate of said network driving circuit so that said bias signal is associated with said transmission rate and said length.

6. The network driving circuit of claim 1, wherein each digital-to-analog conversion unit further comprises:
   a first transistor having a control terminal receiving said digital output signal, a first terminal coupled to said line driver circuit, and a second terminal;
   a second transistor having a control terminal receiving said digital output signal, a first terminal coupled to said line driver circuit, and a second terminal;
   a third transistor having a control terminal receiving said digital output signal, a first terminal coupled to said second terminal of said first transistor, and a second terminal coupled to said main current source; and
   a fourth transistor having a control terminal receiving said digital output signal, a first terminal coupled to said second terminal of said second transistor, and a second terminal coupled to said main current source;

wherein, said auxiliary current source is coupled to said second terminal of said first transistor and said first terminal of said third transistor, or coupled to said second terminal of said second transistor and said first terminal of said fourth transistor.

7. A network driving circuit for outputting a signal to a physical network transmission medium, comprising:
   a digital-to-analog converter (DAC) circuit that comprises a plurality of digital-to-analog conversion units and configured to convert a digital output signal to an analog output signal, each digital-to-analog conversion unit comprising:
      a first auxiliary current source; and
      a second auxiliary current source;
   a transformer circuit, coupled to said DAC circuit, for coupling said analog output signal to said physical network transmission medium; and
   a bias circuit configured for generating a bias signal associated with a length of said physical network transmission medium to control currents of said first auxiliary current source and said second auxiliary current source.

8. The network driving circuit of claim 7 further comprising:
   a line driver circuit, coupled to said DAC circuit, configured for amplifying said analog output signal; and
   a control circuit, coupled to said DAC circuit, configured for generating a control signal according to said length of said physical network transmission medium;
   wherein, said bias circuit generates said bias signal according to said control signal.

9. The network driving circuit of claim 8, wherein when said length becomes longer, said control circuit controls said bias circuit to generate said bias signal with greater magnitude to increase said currents of said first auxiliary current source and said second auxiliary current source, and when said length becomes shorter, said control circuit controls said bias circuit to generate said bias signal with smaller magnitude to reduce said currents of said first auxiliary current source and said second auxiliary current source.

10. The network driving circuit of claim 8, wherein said control circuit generates said control signal further according to a transmission rate of said network driving circuit so that said bias signal is associated with said transmission rate and said length.

11. The network driving circuit of claim 7, wherein each digital-to-analog conversion unit further comprises a main current source, and said bias circuit further generates a main bias signal independent of said length to control a bias voltage of said main current source.

12. The network driving circuit of claim 7, wherein each digital-to-analog conversion unit further comprises a main current source, and a bias voltage of said main current source is controlled by said bias signal.

13. A method of driving a network device to output a signal to a physical network transmission medium, said network device comprising a digital-to-analog converter (DAC) circuit that comprises a plurality of digital-to-analog conversion units, each digital-to-analog conversion unit comprising a first auxiliary current source and a second auxiliary current source, said method comprising:
   detecting a length of said physical network transmission medium;
   generating a control signal according to said length;
   generating a bias signal according to said control signal; and
   applying said bias signal to said first auxiliary current source and said second auxiliary current source to control currents of said first auxiliary current source and said second auxiliary current source.

14. The method of claim 13, wherein when said length becomes longer, said step of generating said bias signal according to said control signal generates said bias signal with greater magnitude to increase said currents of said first auxiliary current source and said second auxiliary current source, and when said length becomes shorter, said step of generating said bias signal according to said control signal generates said bias signal with smaller magnitude to reduce said currents of said first auxiliary current source and said second auxiliary current source.

15. The method of claim 13, wherein each digital-to-analog conversion unit further comprises a main current source, and said method further comprises:
   generating a main bias signal independent of said length; and
   applying said main bias signal to said main current source.

16. The method of claim 13, wherein each digital-to-analog conversion unit further comprises a main current source, and said method further comprises:
   applying said bias signal to said main current source.

17. The method of claim 13, wherein said DAC circuit is configured to convert a digital output signal to an analog output signal, and each digital-to-analog conversion unit further comprises:
   a first transistor having a control terminal receiving said digital output signal, a first terminal outputting said analog output signal, and a second terminal;
   a second transistor having a control terminal receiving said digital output signal, a first terminal outputting said analog output signal, and a second terminal;
   a third transistor having a control terminal receiving said digital output signal, a first terminal coupled to said second terminal of said first transistor, and a second terminal coupled to a main current source; and
   a fourth transistor having a control terminal receiving said digital output signal, a first terminal coupled to said second terminal of said second transistor, and a second terminal coupled to said main current source;
   wherein, said first auxiliary current source is coupled to said second terminal of said first transistor and said first terminal of said third transistor, and said second auxiliary current source is coupled to said second terminal of said second transistor and said first terminal of said fourth transistor.

18. The method of claim 13, wherein said step of generating said control signal generates said control signal further according to a transmission rate of said network device so that said bias signal is associated with said transmission rate and said length.

* * * * *